United States Patent
Chang et al.

(10) Patent No.: US 7,420,188 B2
(45) Date of Patent: Sep. 2, 2008

(54) EXPOSURE METHOD AND APPARATUS FOR IMMERSION LITHOGRAPHY

(75) Inventors: Ching-Yu Chang, Yuansun Village, Yilang County (TW); Chin-Hsiang Lin, Hsin-Chu (TW); Burn Jeng Lin, Hsin-Chu (TW); David Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 307 days.

(21) Appl. No.: 11/251,330

(22) Filed: Oct. 14, 2005

(65) Prior Publication Data

US 2007/0085034 A1    Apr. 19, 2007

(51) Int. Cl.
*G03F 7/20* (2006.01)
(52) U.S. Cl. ............ 250/492.2; 250/492.1; 250/492.21; 355/30; 355/53; 355/67
(58) Field of Classification Search .............. 250/492.2, 250/492.1, 492.21; 355/30, 53, 67
See application file for complete search history.

(56) References Cited

U.S. PATENT DOCUMENTS

| | | | |
|---|---|---|---|
| 4,480,910 A | 11/1984 | Takanashi et al. | |
| 4,509,852 A | 4/1985 | Tabarelli et al. | |
| 7,317,504 B2* | 1/2008 | De Smit et al. | 355/30 |
| 2005/0078286 A1* | 4/2005 | Dierichs et al. | 355/30 |
| 2006/0033898 A1* | 2/2006 | Cadee et al. | 355/53 |
| 2006/0102277 A1* | 5/2006 | Maria Zaal et al. | 156/290 |
| 2006/0154188 A1* | 7/2006 | Hirayama et al. | 430/338 |
| 2007/0004234 A1* | 1/2007 | Goodwin et al. | 438/800 |

OTHER PUBLICATIONS

Lin, Burn J., "Semiconductor Foundry, Lithography, and Partners", Proc. SPIE (The International Society for Optical Engineering), vol. 4688, Jul. 2002, pp. 11-24.
Owa, Soichi, et al., "Immersion Lithography; Its Potential Performance and Issues", Proc. SPIE (The International Society for Optical Engineering), vol. 5040, Jun. 2003, pp. 724-733.
Switkes, M., et al., "Immersion Lithography at 157 nm", Journal of Vacuum Science & Technology B: Microelectronics and Nanometer Structures, vol. 19, Issue 6, Nov. 2001, pp. 2353-2356.

* cited by examiner

*Primary Examiner*—Jack I. Berman
*Assistant Examiner*—Michael J Logie
(74) *Attorney, Agent, or Firm*—Haynes Boone, LLP

(57) ABSTRACT

A method for immersion lithography includes providing a substrate coated with an imaging layer, dispensing a conductive immersion fluid between the substrate and an imaging lens of a lithography system, and performing an exposure process to the imaging layer using a radiation energy through the conductive immersion fluid.

12 Claims, 2 Drawing Sheets

EXPOSURE METHOD AND APPARATUS FOR IMMERSION LITHOGRAPHY

CROSS REFERENCES

The present disclosure is related to the following commonly-assigned U.S. patent applications, the entire disclosures of which are hereby incorporated herein by reference:

(1) U.S. patent application Ser. No. 11/324588 filed Sep. 30, 2005 and entitled "NOVEL TARC MATERIAL FOR IMMERSION WATERMARK REDUCTION," having the same inventor and same assignee as the present invention;

(2) U.S. patent application Ser. No. 11/271639 filed Sep. 30, 2005 and entitled "WATER MARK DEFECT PREVENTION FOR IMMERSION LITHOGRAPHY," having the same inventor and same assignee as the present invention; and (3) U.S. patent application Ser. No. 11/225268 filed Sep. 13, 2005 and entitled "APPARATUS AND METHODS FOR IMMERSION LITHOGRAPHY," having the same inventor and same assignee as the present invention.

BACKGROUND

As semiconductor fabrication technologies are continually progressing to smaller feature sizes such as 65 nanometers, 45 nanometers, and below, immersion lithography methods are being adopted. However, during an exposure process using an immersion lithography system, flowing water can introduce electrostatic charge. The accumulated electrostatic charge causes particle contamination such as particles adhering to surfaces of the immersion lithography system. The adhered particles may further migrate to the wafer surface and causing defects and yield degradations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting.

Figure 1:
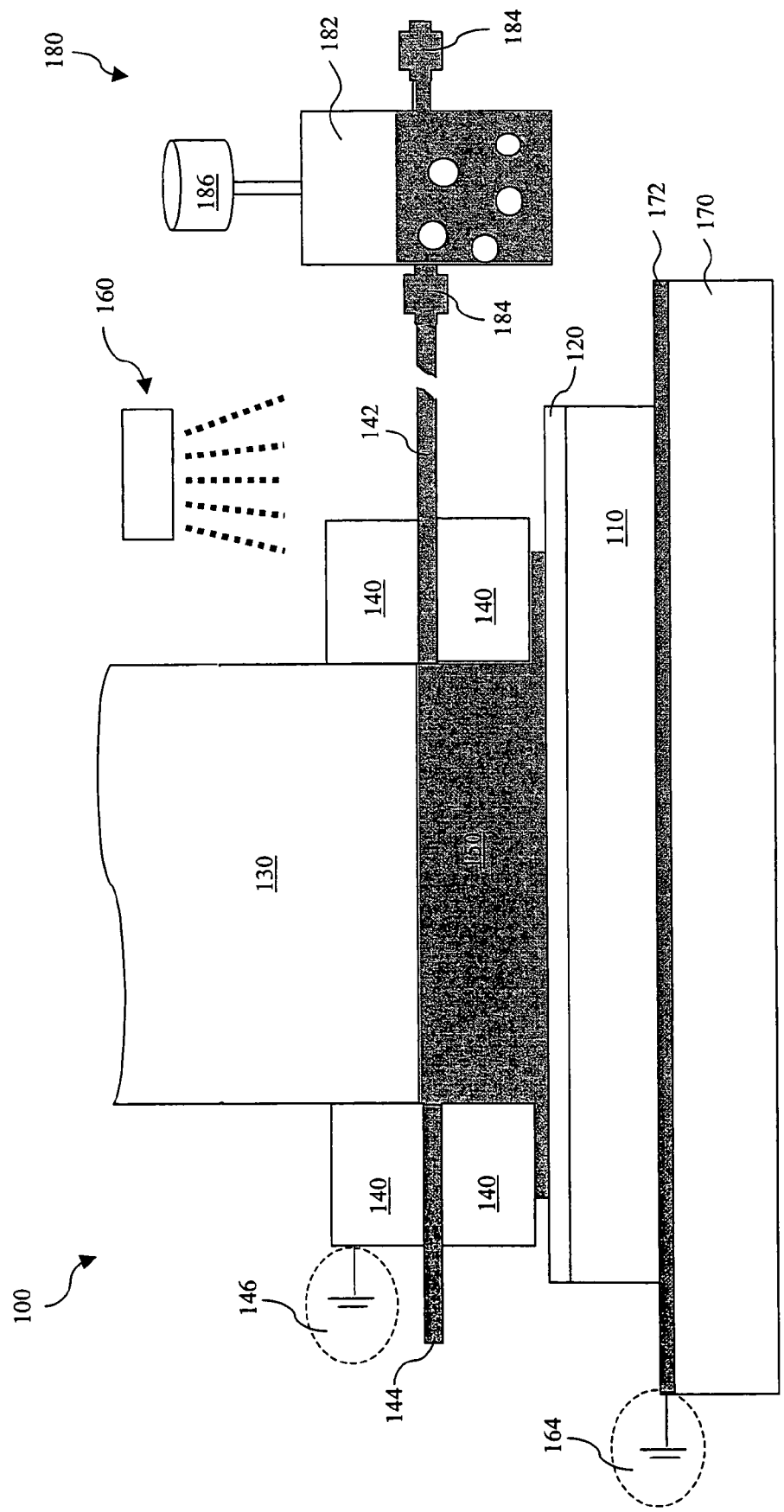
FIG. 1 illustrates a schematic view of one embodiment of an immersion lithography system.

Referring to FIG. 1, illustrated is a schematic view of an embodiment of an immersion lithography apparatus 100 in which a substrate 110 is undergoing immersion lithography processing. The substrate 110 may be a semiconductor wafer having an elementary semiconductor, a compound semiconductor, an alloy semiconductor, or combinations thereof. The semiconductor wafer may include one or more material layers such as poly-silicon, metal, and/or dielectric, to be patterned. The substrate 110 may further include an imaging layer 120 formed thereon. The imaging layer can be a photoresist layer (resist layer, photo sensitive layer, patterning layer) that is responsive to an exposure process for creating patterns. The imaging layer may be a positive or negative type resist material and may have a multi-layer structure. One exemplary resist material is chemical amplifier (CA) resist.

The immersion lithography apparatus 100 includes a lens system (or an imaging lens system) 130. The semiconductor wafer 110 may be positioned on a stage 170 under the lens system 130. The lens system 130 may further include or be integral to an illumination system (e.g., a condenser) which may have a single lens or multiple lenses and/or other lens components. For example, the illumination system may include microlens arrays, shadow masks, and/or other structures. The lens system 130 may further include an objective lens which may have a single lens element or a plurality of lens elements. Each lens element may include a transparent substrate and may further include a plurality of coating layers. The transparent substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering.

The system 100 includes an immersion fluid retaining module 140 for holding an immersion fluid 150. The immersion fluid retaining module 140 may be positioned proximate (such as around) the lens system 130 and designed for other functions, in addition to holding the immersion fluid. The immersion fluid retaining module 140 and the lens system 130 make up (at least in part) an immersion head.

The immersion fluid retaining module 140 may comprise various apertures (or nozzles) for providing the immersion fluid, providing other fluids, providing purge air for drying, removing any purged fluid, and/or performing other proper functions. The module 140 may include an aperture such as inlet 142 as an immersion fluid inlet to provide and transfer the immersion fluid 150 into the space between the lens system 130 and the substrate 110 having the resist layer 120 coated thereon. The module 140 may include an aperture 144 as an immersion fluid outlet to remove the purged immersion fluid and any other purged fluid. The immersion fluid retaining module 140 may include a grounding feature 146 to electrically ground thereof.

The immersion fluid 150 may include water (water solution or de-ionized water-DIW), high n fluid (n is index of refraction, the n value here is larger than 1.44), or conductive immersion fluid such as solutions of carbon dioxide in water (carbonic acid, carbon dioxide water, or $CO_2$ water) that contain small amounts of $H_2CO_3$. Other examples of a conductive fluid may include buffer, acid, base, salt, and surfactant. Particularly, the conductive immersion fluid may include, for the sake of example, maleate, phosphate, chloroacetate, formate, benzoate, acetate, propionate, pyridine, piperazine, Bis-tris, phospate, Tris, tricine, bicine, ethanolamine, methylamine, piperidine, phosphate, cabonic acid/bicabonate, carboxylic acid, or protein. The surfactant may include ionic surfactant and non-ionic surfactant. The surfactant can also have the conductive and cleaning function.

The system further includes a discharge element to neutralize an/or release accumulated charges. In one embodiment, the system 100 includes an ion shower 160 configured to irradiate ions such as H+, Ar+, O2+, O– or O3– ions. The ion shower 160 may be integral to the immersion fluid retaining module or other component of the system 100 for optimized performance.

The system 100 also includes stage 170 to hold the substrate 110 to be processed thereby. The stage 170 is operable to secure and move the substrate 110 relative to the lens system 130. For example, the stage 170 may be designed to be capable of translational and/or rotational displacement for wafer alignment, stepping, and scanning. The stage 170 may include various material suitable to perform precise movement. In one example, the stage 170 may include a glass-ceramic composite material such as ZERODUR (trademark of Schott Glass Technologies, Elmsford, N.Y.). Additionally or alternatively to the ion shower 160, the system 100 may include a conductive features 172 formed on and/or embedded in the stage 170. For example, the conductive feature 172 may be a conductive coating layer formed on various surface of the stage 170. The conductive coating layer may be patterned with various geometries and configurations such as grid, strips, lines in parallel, or other patterns. The stage 170 may further include a grounding feature 164 connected to the stage 170, or particularly, connected to the conductive feature 172 of the stage 170. The conductive coating layer may be formed by a process including sputtering, plating, or chemical vapor deposition (CVD).

A conductive fluid supply system may be coupled to or integrated with the module 140 to generate a conductive immersion fluid to be filled to the space between the lens system 130 and the substrate 110. An exemplary conductive fluid supply system 180 is designed to provide a conductive fluid such as carbon dioxide water. The conductive fluid supply system 180 may include one or more tanks 182 to contain the immersion fluid such as DIW. The tanks 182 may be configured in series through a plurality of flow controllers 184 using master flow controllers (MFCs) or other suitable valves. Additional fluid controllers 184 may include one coupled to the immersion fluid source such as DI water source and another one coupled to the immersion fluid inlet 142. The conductive fluid supply system 180 further includes a carbon dioxide source 186 operable to pump carbon dioxide into DIW in the tank 182, thus resulting in carbonic acid in DIW. The conductive fluid supply system 180 may be designed differently to provide a particular conductive fluid. More features may be added and some features may be avoided for intended functions. The conductive fluid supply system 180 may additionally or alternatively include various valves, fluid lines, and fluid controlling pumps configured to provided the conductive fluid.

The immersion lithography system 100 may further include a radiation source. The radiation source may be a suitable ultraviolet (UV) or extra UV(EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm). The radiation source may also include E-beam.

A photomask (also referred to as a mask or a reticle) may be introduced between the lens system 130 and the patterning layer 120 during an immersion lithography process. The mask may include a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when hitting on an absorption region. The absorption layer may be patterned to have one or more openings through which a light beam may travel without being absorbed by the absorption layer.

The system 100 described above can be use to eliminate electrostatic charge accumulated during an immersion lithography patterning process. Several features may be utilized collectively or separately. For example, the conductive fluid supply system 180 may be utilized to provide a conductive fluid as the immersion fluid during an immersion lithography process and neutralize electrostatic charge introduced therein. Alternatively, at least one of the ion shower 160, the conductive feature 172, and the grounding features 146 and 164 may be utilized to neutralize electrostatic charge. The combination of the ion shower 160 and the conductive feature 172 may enhance the efficiency in removing electrostatic charge, especially electrostatic charge accumulated on surfaces of the stage 170.

Figure 2:
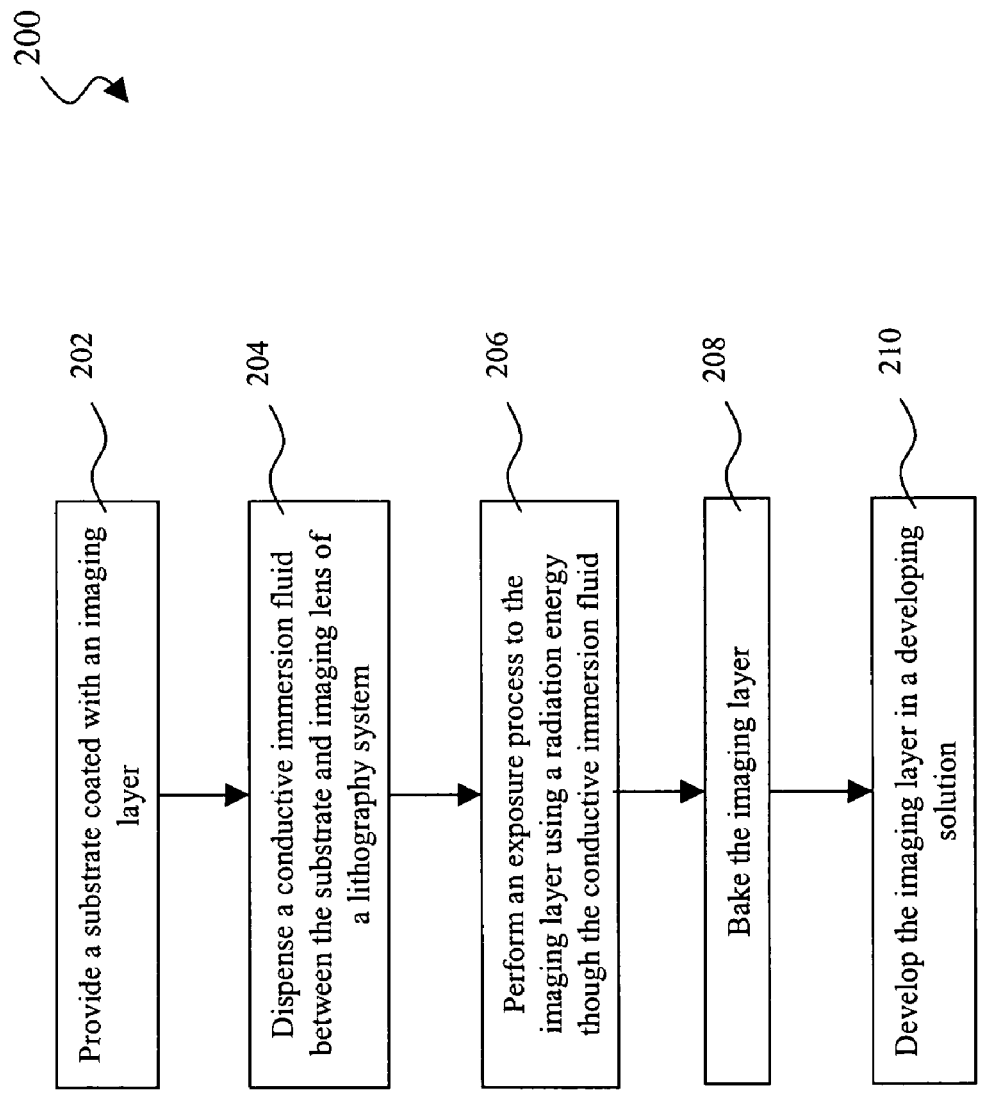
FIG. 2 is a flowchart of one embodiment of a method of immersion photolithography patterning.

FIG. 2 provides a flowchart of one exemplary method of immersion photolithography patterning, which may be implemented in the immersion lithography system 100. The method 200 may begin at step 202 by providing a substrate having an imaging layer coated on one surface to be patterned. The substrate and the imaging layer may be substantially similar to the substrate 110 and the imaging layer 120 of FIG. 1, respectively. The imaging layer may be formed on the substrate by a method such as spin-on coating. The imaging layer may be further baked. Then the substrate may be positioned on a stage of an immersion lithography system such that the imaging layer faces up.

The method proceeds to step 204 to dispense a conductive immersion fluid between the substrate and an imaging lens of the immersion lithography system. The conductive immersion fluid contains ions for electric conduction. The conductive immersion fluid may have a conductivity higher than 10-5 S/m. In one example, the conductive immersion fluid includes a solution of carbon dioxide in water. The solution of carbon dioxide in water may be generated by bubbling carbon dioxide gas into a deionized water using a setup such as the conductive fluid supply system 180 of FIG. 1. The described method and mechanism may provide a conductive immersion fluid that has less contamination, has low cost, and is easy to implement. The conductive immersion fluid may include buffer, acid, base, salt, or surfactant. More particularly, the conductive immersion fluid may include, for the sake of example, maleate, phosphate, chloroacetate, formate, benzoate, acetate, propionate, pyridine, piperazine, Bis-tris, phospate, Tris, tricine, bicine, ethanolamine, methylamine, piperidine, phosphate, cabonic acid/bicabonate, carboxylic acid, or protein.

The conductive immersion fluid may have a pH value predetermined in a range such as between about 1 and 8.5. The conductive immersion fluid may have a pH variation such as a variation +/−1 around the predetermined pH value during the exposure process. The pH value may be tuned to a value about 7 with an expected conductivity such as a conductivity higher than about 10-5 S/m. For example, to make 1000 ml of 0.01 M PIPES (pKa=7.1) buffer having a pH at 7 and ionic strength at about 0.021 M, about 0.0044 mol of acid component and 0.0055 mol of basic component are dissolved and then make up to 1000 ml solution with pure water. The above preparation may be carried out at about 25 0C. Alternatively, about 3.024 g of PIPES free acid (Mr=302.4) may be dissolved in a approximately 900 ml of pure water and then titrate to pH 7 at a temperature about 25 0C. Then make up the solution to 1000 ml with pure water. Thus prepared buffer solution will have a pH value about 7 at temperature 25 0C.

Alternatively, an acid buffer may be employed with a predetermined pH value. For example, to make 1000 ml of 0.01 M PIPES (pKa=7.1) buffer having a pH at 7 and ionic strength at about 0.015 M, about 0.0073 mol of acid component and 0.0026 mol of basic component are dissolved and then make up to 1000 ml solution with pure water. The above preparation may be carried out at about 25 0C. Alternatively, about 3.024 g of PIPES free acid (Mr=302.4) may be dissolved in a approximately 900 ml of pure water and then titrate to pH 6.49 at a temperature about 25 0C. Then make up the solution to 1000 ml with pure water. Thus prepared, a buffer solution will have a pH about 6.5 at a temperature of about 25 0C. The above described methods to prepare a buffer having a predetermined pH value only serve as examples. The acid buffer may realize various advantages such as controlling the resist profile, and reducing contaminations from water residues. In another example, the acid buffer may induce chemical amplification to a thin top layer of the imaging layer, result a blanket removal of the thin top layer, and eliminate any deviated resist profile in the thin top layer.

The method 200 proceeds to step 206 to perform an exposure process to the imaging layer coated on the substrate. During the exposure process, a radiation energy such as ultraviolet (UV) or extra ultraviolet (EUV) may be employed and directed through an imaging lens system and a mask having a predefined pattern. The radiation energy is further directed through the conductive immersion fluid dispensed between the substrate and the imaging lens. The radiation energy is then directed to the imaging layer coated on the substrate. In another embodiment, the radiation energy can also be directed through the DI fluid dispensed between the substrate and the imaging lens. I this embodiment, the conductive fluid can be replaced by a DI immersion fluid before the exposure process.

The method 200 may proceed to step 208 to bake the imaging layer after the exposure process (also referred to as an post exposure baking or PEB). The PEB may be implemented at a predefined temperature and duration. For example, the PEB may use a temperature ranging between about 85 0C and 150 0C.

The method 200 may proceed to step 210 to develop the imaging layer in a developing solution. The exposed regions of the imaging layer are dissolved in the developing solution if the imaging layer is a positive-type, or the unexposed regions are dissolved if the imaging layer is a negative-type. Other processing steps may be alternatively or additionally incorporated into the method 200 according the resist material and the immersion lithography system in a particular application.

The method 200 may be performed in the immersion lithography system 100 of FIG. 1 or a more conventional immersion lithography system operable with a conductive immersion fluid and capable of supplying thereof. Since the conductive fluid is utilized as an immersion fluid, the electrostatic charge accumulated during the exposure process can be eliminated and therefore the particles and pattern defects caused thereby are reduced or eliminated as well.

Thus, the present disclosure provides a method for immersion lithography. In one embodiment, the method includes providing a substrate coated with an imaging layer; dispensing a conductive immersion fluid between the substrate and an imaging lens of a lithography system; and performing an exposure process to the imaging layer using a radiation energy through the conductive immersion fluid.

In another embodiment, the method includes baking the imaging layer and developing the imaging layer in a developing solution. Providing the conductive immersion fluid may include providing a conductive immersion fluid with a conductivity higher than about 10-5 S/m. The dispensing of the conductive immersion fluid may includes dispensing deionized water having carbonic acid. The dispensing of the conductive immersion fluid may include bubbling deionized water with carbon dioxide. The conductive immersion fluid may include a fluid selected from the group consisting of buffer, acid, base, salt, and surfactant. More particularly, the conductive immersion fluid may include a material selected from the group consisting of maleate, phosphate, chloroacetate, formate, benzoate, acetate, propionate, pyridine, piperazine, Bis-tris, phospate, Tris, tricine, bicine, ethanolamine, methylamine, piperidine, phosphate, cabonic acid/bicabonate, carboxylic acid, and protein.

In another embodiment, a method for immersion lithography includes providing a lithography system having an imaging lens module and a stage; providing a substrate coated with an imaging layer, positioned on the stage; dispensing an immersion fluid between the substrate and the imaging lens module; and performing an exposure process to the imaging layer using a radiation energy through the immersion fluid with a reduced electrostatic discharge. The dispensing of the immersion fluid may include dispensing a conductive fluid. The conductive fluid may have an enhanced conductivity higher than 10-5 S/m. The performing of the exposure process may include introducing ions for ion showering. The providing of the lithography system comprises providing a stage with a conductive feature integrated therewith. The conductive feature may include a patterned conductive coating layer formed on the stage.

The present disclosure also provides an immersion lithography apparatus. In one embodiment, the apparatus includes an imaging lens module having a front surface; a stage configured underlying the front surface of the imaging lens; a fluid retaining module configured to hold a fluid at least partially filling a space between the front surface and a substrate on the substrate stage; and a discharge element configured for reducing electrostatic discharge. The discharge element may include an ion shower. The ion shower is designed to emit ions. The discharge element may include a conductive feature integrated to the stage. The discharge element may include a grounding feature integrated to at least one of the stage and the fluid retaining module. The apparatus may further include a carbon dioxide water generator. The carbon dioxide water generator may include a mechanism of injecting carbon dioxide into a deionized water.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    positioning a substrate coated with an imaging layer onto a stage of a lithography system;
    dispensing an immersion fluid between the substrate and the imaging lens module;
    enhancing a conductive aspect of the immersion fluid by including a buffer in the immersion fluid; and performing an exposure process to the imaging layer using a radiation energy through the immersion fluid with a reduced electrostatic discharge due to the enhanced conductive aspect of the immersion fluid;

wherein the enhancement of the conductive aspect includes irradiating ions for ion showering during the exposure process.

2. The method of claim 1, wherein the dispensing of the immersion fluid is electrically connected to a voltage potential.

3. The method of claim 1, wherein the conductive fluid comprises an index of refraction greater than about 1.44.

4. The method of claim 1, wherein the stage includes a conductive feature integrated therewith.

5. The method of claim 4, wherein the conductive feature comprises a patterned conductive coating layer formed on the stage.

6. An immersion lithography apparatus, comprising:

an imaging lens module having a front surface;

a stage configured underlying the front surface of the imaging lens;

a fluid retaining module configured to hold a fluid at least partially filling a space between the front surface and a substrate on the substrate stage; and a discharge element integrated with at least one of the fluid retaining module and the stage, and configured for reducing electrostatic discharge.

7. The apparatus of claim 6, wherein the discharge element comprises an ion shower.

8. The apparatus of claim 7, wherein the ion shower is designed to emit ions selected from the group consisting of $H+$, $Ar+$, $O2+$, $O+$, and $O3-$.

9. The apparatus of claim 6, wherein the discharge element comprises a conductive feature integrated to the stage.

10. The apparatus of claim 6, wherein the discharge element comprises a grounding feature integrated to at least one of the stage and the fluid retaining module.

11. The apparatus of claim 6, further comprising a carbon dioxide water generator.

12. The apparatus of claim 11, wherein the carbon dioxide water generator comprises a mechanism of injecting carbon dioxide into a deionized water.

* * * * *